US010615791B2

(12) United States Patent
Le Bars et al.

(10) Patent No.: US 10,615,791 B2
(45) Date of Patent: Apr. 7, 2020

(54) DEVICE FOR CONTROLLING A TRANSISTOR

(71) Applicant: THALES, Courbevoie (FR)

(72) Inventors: David Le Bars, Brest (FR); Benoît Morel, Brest (FR); Hervé Stephan, Brest (FR); Sébastien Segonnes, Brest (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/340,053

(22) PCT Filed: Oct. 17, 2017

(86) PCT No.: PCT/EP2017/076405
§ 371 (c)(1),
(2) Date: Apr. 5, 2019

(87) PCT Pub. No.: WO2018/073204
PCT Pub. Date: Apr. 26, 2018

(65) Prior Publication Data
US 2020/0044649 A1 Feb. 6, 2020

(30) Foreign Application Priority Data
Oct. 18, 2016 (FR) .................................... 16 01507

(51) Int. Cl.
H03B 1/00 (2006.01)
H03K 17/691 (2006.01)
(Continued)

(52) U.S. Cl.
CPC ............ H03K 17/691 (2013.01); H02M 1/08 (2013.01); H02M 3/33569 (2013.01); H03K 2217/0081 (2013.01)

(58) Field of Classification Search
CPC ....... H01L 2924/00; H01L 2224/49175; H01L 2224/48247; H01L 2224/48472; H02M 3/33507
See application file for complete search history.

(56) References Cited

U.S. PATENT DOCUMENTS 5,910,746 A   8/1999 Fordyce
6,094,087 A   7/2000 He et al.
(Continued)

FOREIGN PATENT DOCUMENTS

DE    3243860 A1   8/1983

OTHER PUBLICATIONS

Balogh, Laszlo, "Design and application guide for high speed MOSFET gate drive circuits", Internet Citation, (pp. 1-37), XP00252367, Jan. 1, 2001 (Jan. 1, 2001).
(Continued)

Primary Examiner — Sibin Chen
(74) Attorney, Agent, or Firm — Arent Fox LLP

(57) ABSTRACT

The present invention relates to a device for controlling a transistor, comprising:
  a separating assembly for generating a first voltage,
  a transformer for obtaining a first and second converted voltage from the first voltage,
  a rectifier circuit for generating a third voltage from parts of the same sign of the first converted voltage and of the opposite of the second converted voltage,
  a latch for generating a fourth voltage from the converted voltages,
  a switching assembly for multiplying the third voltage with a fourth voltage normalized in order to obtain a multiplied voltage, and
  a shifting circuit for shifting the multiplied amplitude in order to obtain a control voltage.

10 Claims, 3 Drawing Sheets

Figure 3:
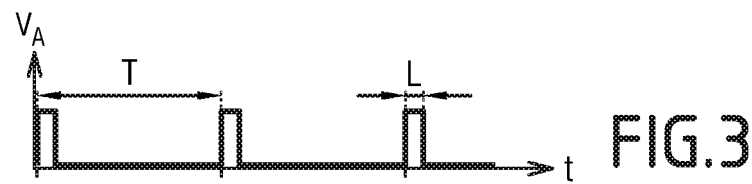

(51) Int. Cl.
H02M 1/08 (2006.01)
H02M 3/335 (2006.01)

(56) References Cited

U.S. PATENT DOCUMENTS

| | | | |
|---|---|---|---|
| 6,496,047 | B1 | 12/2002 | Iskander et al. |
| 9,812,971 | B1 * | 11/2017 | Tschirhart ......... H02M 3/33507 |
| 2002/0175719 | A1 | 11/2002 | Cohen |
| 2010/0072971 | A1 | 3/2010 | Nuebling et al. |
| 2011/0222316 | A1 | 9/2011 | Kato |

OTHER PUBLICATIONS

International Search Report, issued by International Searching Authority in corresponding International Application No. PCT/EP2017/076405, dated Dec. 14, 2017.

Lovatt, H. C. et al., "Design of a 3-Phase, Mosfet Inverter and Associated Gate-Drive Circuit", Proceedings of the European Conference on Power Electronics and Applications, (EPE). AACHEN, Dusseldorf, Epe Secretariat, DE, vol. 1, pp. 165-169, XP000143384, (1989).

Search Report issued by the French Patent Office in counterpart French Application No. 1601507, dated Jul. 19, 2017.

* cited by examiner

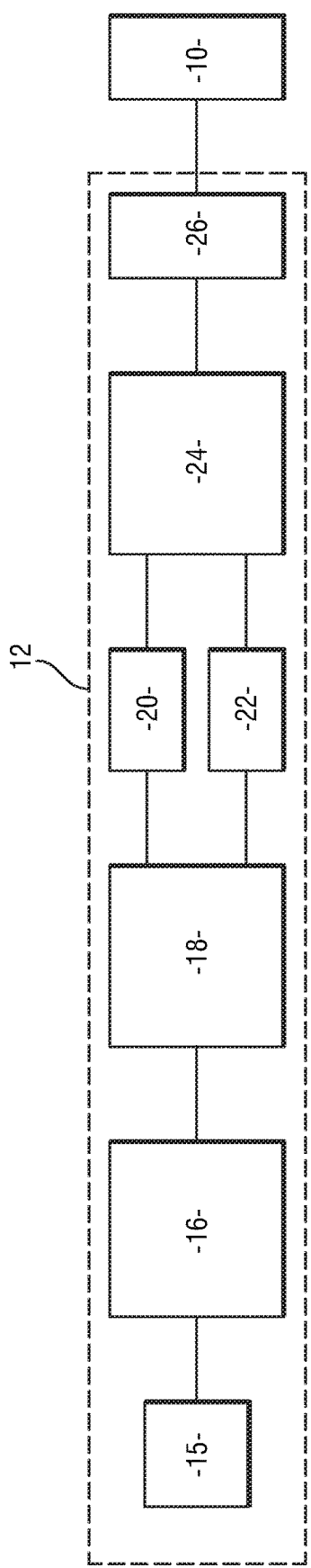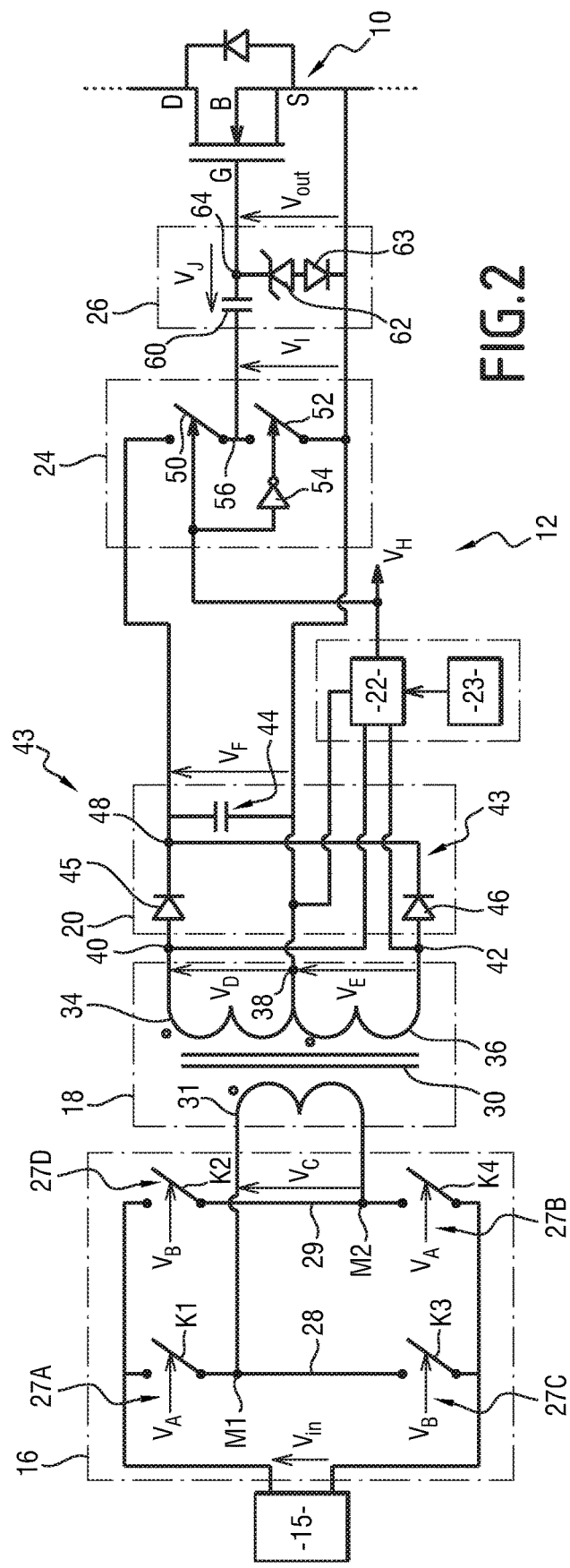

DEVICE FOR CONTROLLING A TRANSISTOR

CROSS-REFERENCE TO RELATED APPLICATIONS

This application is a National Stage Entry of International Patent Application No. PCT/EP2017/076405, filed Oct. 17, 2017, which claims priority to French Patent Application No. 16 01507, filed Oct. 18, 2016. The disclosure of the priority applications are incorporated in their entirety herein by reference.

The present invention relates to a device for controlling a transistor. The present invention also relates to a converter comprising a transistor and such a device for controlling the transistor. The present invention also relates to an on-board system comprising such a converter.

In the context of the development of current converters, the use of MOSFET transistors (Metal Oxide Semiconductor Field Effect Transistor) made from silicon carbide makes it possible to improve the performance of such converters. In particular, silicon carbide MOSFET transistors make it possible to obtain converters performing several conversion functions within a same card. Furthermore, such transistors make it possible to obtain a better efficiency relative to silicon MOSFET transistors.

However, the current control circuits are unsuitable for controlling silicon carbide transistors. In particular, such control circuits generally have a symmetrical control voltage that is capable of damaging silicon carbide transistors.

There is therefore a need for control device suitable for controlling all types of transistors, in particular silicon carbide transistors, without risk of damaging the transistor controlled by said device.

To that end, the invention relates to a device for controlling a transistor, the device comprising:
- a separating assembly for generating a first voltage from a DC input voltage, a first control signal and a second control signal, the first control signal and the second control signal each being formed by pulses with no temporal overlap between the pulses of said control signals, the first voltage being formed by:
  - pulses of amplitude equal to the input voltage and in phase with the pulses of the first control signal, and
  - pulse of amplitude equal to the opposite of the input voltage and in phase with the pulses of the second control signal,
- a transformer connected to the separating assembly, the transformer comprising two secondary windings, the two secondary windings being connected to one another at a midpoint, the first secondary winding being able to convert the first voltage to obtain a first converted voltage, the second secondary winding being able to convert the first voltage to obtain a second converted voltage ($V_E$), each of the first and second converted voltage being formed by:
  - pulses of amplitude with the same sign as the first voltage and in phase with the pulses of the first voltage having an amplitude equal to the input voltage, and
  - pulses of amplitude with the opposite sign from the first voltage and in phase with the pulses of the first voltage having an amplitude equal to the opposite of the input voltage.
- a rectifier circuit able to extract the parts of the same sign from the first converted voltage and of opposite sign from the second converted voltage and to generate a third voltage from the extracted parts of the same sign,
- a latch able to generate a fourth voltage from the converted voltages, the fourth voltage having a high state and a low state, the high state being triggered as a function of the sign of the amplitude of the first converted voltage, the low state being triggered as a function of the sign of the amplitude of the opposite of the second converted voltage,
- a switching assembly able to multiply the third voltage by the normalized state of the fourth voltage to obtain a multiplied voltage, the multiplied voltage having two states corresponding to the states of the fourth voltage, one of the states having a value equal to the third voltage, the other state having a nil value,
- a shifting circuit able to shift the amplitude of the multiplied voltage to obtain a control voltage of the transistor, the control voltage having:
  - a peak-to-peak amplitude equal to the third voltage,
  - a high state corresponding to the high state of the fourth voltage, and
  - a low state corresponding to the low state of the fourth voltage and in which the sign of the control voltage is opposite the sign of the high state of the control voltage.

According to specific embodiments, the control device comprises one or more of the following features, considered alone or according to any technically possible combinations:
- each of the rectifier circuit and the latch is directly connected to the transformer;
- each of the first secondary winding and the second secondary winding is able to convert the first voltage by multiplying it by a same multiplication coefficient;
- the first winding extends between a first terminal and the midpoint and the second winding extends between a second terminal and the midpoint, the rectifier circuit being connected to the midpoint and each of the first terminal and the second terminal, the latch being connected to the first terminal and the second terminal;
- the rectifier circuit comprises:
  - a rectifier able to rectify the first converted voltage and the opposite of the second converted voltage to obtain a rectified voltage, the rectifier comprising a first diode and a second diode, the first diode being able to rectify the first converted voltage, the second diode being able to rectify the opposite of the second converted voltage, and
  - a capacitor able to charge itself to obtain the third voltage.
- the high state of the fourth voltage is triggered during rising edges of the positive pulses of the converted first voltage, the low state of the fourth voltage being triggered during rising edges of the positive pulses of the opposite of the converted second voltage;
- the multiplied voltage has two states, the shifting circuit comprising a capacitor and a Zener diode; the Zener diode being able, in one of the states of the multiplied voltage, to charge the capacitor to a fifth voltage equal to the third voltage decreased by the voltage of the Zener diode, and to produce a control voltage of the transistor equal to the voltage of the Zener diode;
- the Zener diode is able, in the other state of the multiplied voltage, to produce a control voltage of the transistor equal to the opposite of the fifth voltage present across the terminals of the capacitor.

The invention also relates to a converter comprising at least one transistor and at least one device for controlling the transistor as previously described.

The invention also relates to an on-board system comprising such a converter.

Figure 4:
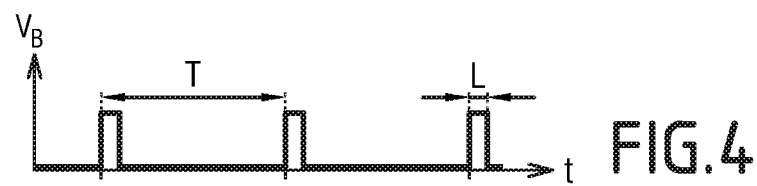
Figure 5:
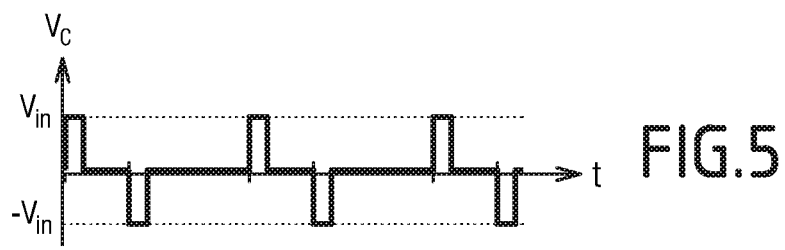
Figure 6:
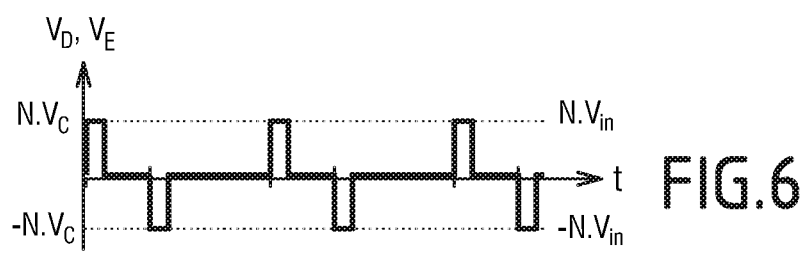
Figure 10:
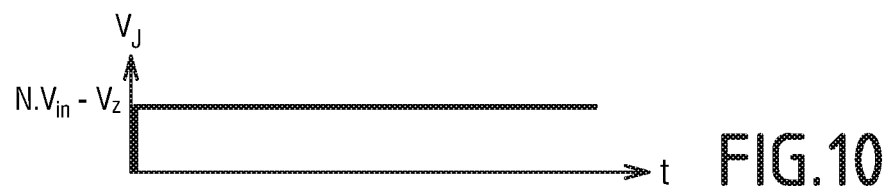
Figure 11:
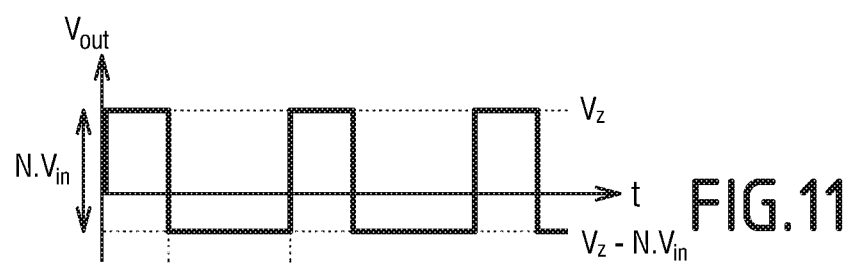
Figure 12:
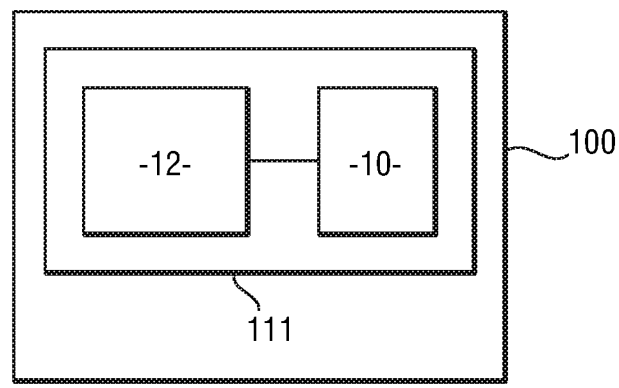

Other features and advantages of the invention will appear upon reading the following description of embodiments of the invention, provided solely as an example and done in reference to the drawings, which are:

FIG. 1, a block diagram of an example of a transistor and a device for controlling the transistor, FIG. 2, a schematic view of an electrical circuit comprising the transistor and the device for controlling the transistor of FIG. 1, FIGS. 3 and 4, a timing diagram of a first control signal, respectively a second control signal, FIGS. 5 and 6, a timing diagram of a first voltage, respectively a first and second converted voltage, FIGS. 7 to 11, a timing diagram of a third voltage, respectively of a fourth voltage, respectively of a multiplied voltage, respectively of a fifth voltage, respectively of a control voltage, and FIG. 12, a schematic view of an on-board system.

A transistor 10 and a device 12 for controlling such a transistor 10 are illustrated by FIGS. 1 and 2.

In the example illustrated by FIG. 2, the transistor 10 comprises a gate G, a source S, a drain D and a base B.

The transistor 10 is for example a MOSFET transistor. Such a MOSFET transistor is for example a silicon transistor or a silicon carbide transistor. Relative to silicon transistors, silicon carbide transistors have a higher voltage behavior, a higher switching speed, and a higher operating temperature.

The control device 12 is able to generate a control voltage $V_{out}$ of the transistor 10, and more particularly, a control voltage $V_{out}$ of the gate of the transistor 10.

The control device 12 comprises, successively connected to one another, a voltage source 15, a separating assembly 16, a transformer 18, a rectifier circuit 20, a latch 22, a switching assembly 24 and a shifting circuit 26.

The voltage source 15 is able to deliver a DC voltage $V_{in}$ to the input of the separating assembly 16.

The separating assembly 16 comprises a set of switches controlled by periodic pulse signals to deliver a first voltage $V_C$ as output. The first voltage $V_C$ is formed by successive pulses of amplitude alternately equal to the input voltage $V_{in}$ and equal to the opposite of the input voltage $V_{in}$.

In particular, in the example of FIG. 2, the separating assembly 16 comprises two branches 28, 29 connected in parallel and supplied by the input voltage $V_{in}$. The two branches 28, 29 of the separating assembly 16 thus form a bridge, called "H bridge".

The first branch 28 comprises two switches K1 and K3 connected in series at a midpoint M1. The second branch 29 comprises two switches K2 and K4 connected in series at a midpoint M2. Each switch K1, K2, K3, K4 is controlled by a control input 27A, 27B, 27C, 27D. For example, when the switches K1, K2, K3, K4 are field-effect transistors, the control inputs 27A, 27B, 27C, 27D correspond to the gates of said transistors.

The control inputs 27A, 27B of the switch K1 of the first branch 28 and the switch K4 of the second branch 29 are controlled by a first control signal $V_A$. An example of a timing diagram of the first control signal $V_A$ is illustrated by FIG. 3.

The control inputs 27C, 27D of the switch K3 of the first branch 28 and the switch K2 of the second branch 29 are controlled by a second control signal $V_B$. An example of a timing diagram of the second control signal $V_B$ is illustrated by FIG. 4.

The first control signal $V_A$ and the second control signal $V_B$ are generated by a pulse generator.

Each of the first control signal $V_A$ and the second control signal $V_B$ is made up of pulses with a constant width L, repeating with a constant period T such that the form factor L/T of each pulse is strictly less than 50 percent (%). The form factor of a pulse is the ratio of the width of the pulse to the period between the pulse and a consecutive pulse.

The high level of the pulses of the control signals $V_A$, $V_B$ corresponds to the closed state of the corresponding switch K1, K2, K3, K4. The low level of the pulses of the control signals $V_A$, $V_B$ corresponds to the open state of the corresponding switch K1, K2, K3, K4. The first control signal $V_A$ and the second control signal $V_B$ are time-shifted relative to one another such that there is no temporal overlap between the pulses of the first control signal $V_A$ and the second control signal $V_B$. This is necessary so as not to short-circuit the voltage source 15.

Alternatively, the first control signal $V_A$ and the second control signal $V_B$ are formed by pulses of different widths $L_A$ and $L_B$ and/or different pulse repetition periods $T_A$ and $T_B$. The first control signal $V_A$ and the second control signal $V_B$ are time-shifted relative to one another such that there is no temporal overlap between the pulses of the first control signal $V_A$ and the second control signal $V_B$.

The separating assembly 16 is configured to deliver the first voltage $V_C$, illustrated by FIG. 2, from the input voltage $V_{in}$, of the first control signal $V_A$ and the second control signal $V_B$.

The first voltage $V_C$, illustrated in FIG. 5, is formed by:
pulses of amplitude equal to the input voltage $V_{in}$ and in phase with the pulses of the first control signal $V_A$, and
pulse of amplitude equal to the opposite of the input voltage $V_{in}$ and in phase with the pulses of the second control signal $V_B$.

Thus, to within the transitional responses of the switches, the first voltage $V_C$ is expressed in the form of the following expression:

$$V_C = V_{in} \cdot V_{an} - V_{in} \cdot V_{bn}$$

where
$V_{in}$ is the input voltage,
$V_{an}$ is the first normalized control signal (value 0 or 1), and
$V_{bn}$ is the second normalized control signal (value 0 or 1).

The transformer 18 is supplied at the input with the first voltage $V_C$.

The transformer 18 comprises a primary winding 31 and two secondary windings 34, 36.

The term "winding" refers to an electric coil.

The primary winding 31 is directly connected on the one hand to the midpoint M1 between the switches K1 and K3 of the first branch 28 of the separating assembly 16, and on the other hand, to the midpoint M2 between the switches K2 and K4 of the second branch 29 of the separating assembly 16 so as to receive the first voltage $V_C$.

The secondary windings 34 and 36 have the same number of turns. The secondary windings 34 and 36 are connected to one another at a midpoint 38.

The first secondary winding 34 extends between a first terminal 40 and the midpoint 38. The second secondary winding 36 extends between a second terminal 42 and the midpoint 38.

The two secondary windings 34, 36 having the same number of turns, each of the first secondary winding 34 and the second secondary winding 36 in association with the primary winding 31 is able to convert the first voltage $V_C$ by multiplying the amplitude of said first voltage $V_C$ by a same multiplication coefficient N. The multiplication coefficient N is defined as the ratio of the number of turns of each secondary winding 34, 36 of the transformer 18 by the number of turns of the primary winding 31 of the transformer 18.

Thus, the first secondary winding 34 in association with the primary winding 31 is able to convert the first voltage $V_C$ to obtain a first converted voltage $V_D$. The second winding 36 in association with the primary winding 31 is able to convert the first voltage $V_C$ to obtain a second converted voltage $V_E$. Inasmuch as the multiplication coefficient N is the same for each of the first and second winding 34, 36, the second converted voltage $V_E$ is identical to the first converted voltage $V_D$. An example of a timing diagram of the first and second converted voltage $V_D$, $V_E$ is illustrated by FIG. 6.

Each of the first and second converted voltage $V_D$, $V_E$ is formed by:
pulses of amplitude equal to the multiplication coefficient N multiplied by the first voltage $V_C$ and in phase with the pulses of the first voltage $V_C$ having an amplitude equal to the input voltage $V_{in}$, and
pulses of amplitude equal to the multiplication coefficient N multiplied by the opposite of the first voltage $V_C$ and in phase with the pulses of the first voltage $V_C$ having an amplitude equal to the opposite of the input voltage $V_{in}$.

The rectifier circuit 20 is able to extract the parts of the same sign from each converted voltage $V_D$, $V_E$ and to deliver a third voltage $V_F$ from the extracted parts of the same sign. The expression "parts of the same sign" refers to the positive or negative component of a signal.

Figure 7:

The third voltage $V_F$ is a DC voltage of amplitude equal to the peak value of the parts of the same sign of each converted voltage, and therefore the input voltage $V_{in}$ multiplied by the multiplication coefficient N of the transformer 18. An example of a timing diagram of the third voltage $V_F$ is illustrated by FIG. 7.

The rectifier circuit 20 is directly connected to each secondary winding 34, 36 of the transformer 18. Thus, the control voltage $V_{out}$ generated at the output of the device 12 is galvanically isolated from the input voltage $V_{in}$, without adding other isolation devices such as additional transformers or optocouplers.

The rectifier circuit 20 comprises a rectifier 43 and a capacitor 44.

The rectifier circuit 20 has a terminal connected to the midpoint 38 and a terminal connected to the first terminal 40 so as to be supplied by the first converted voltage $V_D$. The rectifier circuit 20 also has a terminal connected to the midpoint 38 and a terminal connected to the second terminal 42 so as to be supplied by the second converted voltage $V_E$.

The rectifier 43 is able to rectify the converted voltage $V_D$ and the opposite of the converted voltage $V_E$ and to charge the capacitor 44 in order to obtain a third voltage $V_F$.

The rectifier 43 comprises a first diode 45 and a second diode 46.

The anode of the first diode 45 is connected to the first terminal 40. The anode of the second diode 46 is connected to the second terminal 42. The cathodes of each of the first diode 45 and the second diode 46 are connected to one another at a connection point 48.

The first diode 45 is able to rectify the first converted voltage $V_D$. The second diode 46 is able to rectify the opposite of the second converted voltage $V_E$. In particular, each of the diodes 45, 46 only allowing the current to pass in one direction, said diodes 45, 46 provide the assembly formed by the capacitor 44 and the charge in parallel, with a voltage relative to the midpoint 38 that has a unique sign. In the example illustrated by FIG. 2, the orientation of the diodes 45, 46 causes the positive parts of the first converted voltage $V_D$ and the opposite of the second converted voltage $V_E$ to pass. In a variant in which the diodes 45, 46 are oriented in the opposite direction, the negative parts of the first converted voltage $V_D$ and the opposite of the second converted voltage $V_E$ pass.

The capacitor 44 is connected on the one hand to the midpoint 38, and on the other hand to the connection point 48.

The latch 22 is for example an RS latch (abbreviation for "Reset" and "Set").

The latch 22 is directly connected to the transformer 18.

The latch 22 comprises two inputs and at least one output.

The first input of the latch 22 receives the first converted voltage $V_D$. The second input of the latch 22 receives the second converted voltage $V_E$. The latch 22 is also supplied by a power source 23.

Figure 8:
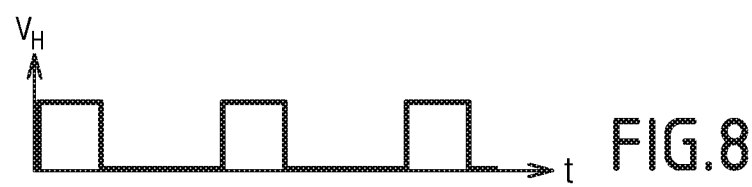

The latch 22 is able to deliver, as output, a fourth voltage $V_H$ from the converted voltages $V_D$ and $V_E$. The fourth voltage $V_H$ is a logic signal having a high state and a low state. The first input of the latch 22 makes it possible to deliver the high state of the fourth voltage $V_H$. The second input of the latch 22 makes it possible to deliver the low state of the fourth voltage $V_H$. An example of a timing diagram of the fourth voltage $V_H$ is illustrated by FIG. 8.

In the example illustrated by the figures, the high state of the fourth voltage $V_H$ is triggered during rising edges of the positive pulses of the first converted voltage $V_D$. The low state of the fourth voltage $V_H$ is triggered during rising edges of the positive pulses of the opposite of the second converted voltage $V_E$, i.e., rising edges of the negative pulses of the second converted voltage $V_E$.

The switching assembly 24 is able to multiply the third voltage $V_F$ by the normalized state of the fourth voltage $V_H$ to obtain a multiplied voltage $V_I$.

The switching assembly 24 is connected to the rectifier circuit 20 so as to receive the third voltage $V_F$. The switching assembly 24 is connected to the latch 22 so as to receive the fourth voltage $V_H$.

The switching assembly 24 comprises two switches 50, 52 and a reverse amplifier 54.

The two switches 50, 52 are connected in series at a midpoint 56.

The first switch 50 comprises an input for controlling said switch 50 receiving the fourth voltage $V_H$. The second switch 52 comprises an input for controlling said second switch 52 receiving the opposite of the fourth voltage $V_H$, since the inverter 54 is connected between the output of the latch 22 and the input for controlling the second switch 52.

Figure 9:
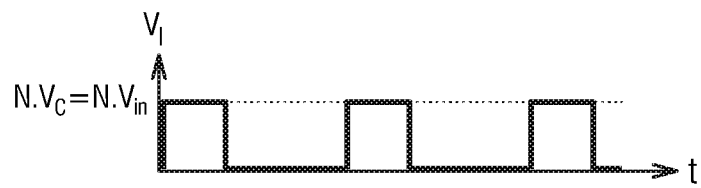

One of the states of the fourth voltage $V_H$ makes the switch 50 on (closed) and the switch 52 off (open). The other state of the fourth voltage $V_H$ makes the switch 50 off (open) and the switch 52 on (closed). For example, the high states of the fourth voltage $V_H$ turn on the switch 50 and turn off the switch 52, such that the multiplied voltage $V_I$ is equal to the third voltage $V_F$. The low states of the fourth voltage $V_H$ turn off the switch 50 and turn on the switch 52, such that the multiplied voltage $V_I$ is equal to zero. An example of a timing diagram of the multiplied voltage $V_I$ is illustrated by FIG. 9.

The shifting circuit 26 able to shift the amplitude of the multiplied voltage $V_I$ to obtain a control voltage $V_{out}$ of the transistor 10.

The control voltage $V_{out}$ has a peak-to-peak amplitude equal to the third voltage $V_F$. Furthermore, the control voltage $V_{out}$ has: a high state corresponding to the first state of the fourth voltage $V_H$ and a low state corresponding to the second state of the fourth voltage $V_H$ and in which the sign of the control voltage $V_{out}$ is opposite the sign of the high state.

In the example illustrated by FIG. 2, the shifting circuit 26 comprises a capacitor 60, a Zener diode 62 and a diode 63.

The shifting circuit 26 receives the multiplied voltage $V_I$.

The capacitor 60 has a terminal connected at the output of the switching assembly 24 to the midpoint 56 between the two switches 50, 52 and a terminal connected to the cathode of the Zener diode 62 at a connection point 64.

The anode of the Zener diode 62 is connected to the anode of the diode 63. Thus, the Zener diode 62 and the diode 63 are arranged head to tail.

The cathode of the diode 63 is connected to the terminal of the capacitor 44 of the rectifier circuit 20, which is connected to the midpoint 38.

The diode 63 is able to block the passage of the current.

When the first switch 50 is on and the second switch 52 is off, the multiplied voltage $V_I$ is equal to the third voltage $V_F$, the capacitor 60 is then charged to a fifth voltage $V_J$ equal to the third voltage $V_F$ decreased by the voltage $V_Z$ of the Zener diode 62 (to within the voltage drop of the diode 63) and the control voltage $V_{out}$ is equal to the voltage $V_Z$ of the Zener diode (to within the voltage drop of the diode 63). The voltage $V_Z$ of the Zener diode 62 is direct.

When the first switch 50 is off and the second switch 52 is on, the multiplied voltage $V_I$ is nil and the control voltage $V_{out}$ is equal to the opposite of the fifth voltage $V_J$, i.e., to the voltage $V_Z$ of the Zener diode (to within the voltage drop of the diode 63) minus the third voltage $V_F$. The diode 63 makes it possible to prevent the capacitor 60 from discharging into the Zener diode 62, which alone would be on and would short-circuit the capacitor 60.

Examples of timing diagrams of the fifth voltage $V_J$ and the control voltage $V_{out}$ are respectively illustrated by FIGS. 10 and 11.

The previous explanation is given as an example, ignoring the value of the voltage of the diode 63. If the voltage of the diode 63 is not ignored, the previous explanation remains valid by replacing the amplitude of the voltage $V_Z$ of the Zener diode 62 by the sum of the amplitudes of the voltage $V_Z$ of the Zener diode 62 and the voltage drop of the diode 63.

The operation of the device 12 for controlling the transistor 10 will now be described.

Initially, the separating assembly 16 generates a first voltage $V_C$ from the input voltage $V_{in}$, of the first control signal $V_A$ and the second control signal $V_B$.

Next, the first secondary winding 34 of the transformer 18 in association with the primary winding 31 converts the first voltage $V_C$ to obtain a first converted voltage $V_D$. Likewise, the second secondary winding 36 of the transformer 18 in association with the primary winding 31 converts the first voltage $V_C$ to obtain a second converted voltage $V_E$.

Then, the rectifier circuit 20 extracts the parts of the same sign from each converted voltage $V_D$, $-V_E$ and delivers a third voltage $V_F$ from the extracted parts of the same sign.

In particular, the rectifier 43 rectifies the converted voltage $V_D$ and the opposite of the converted voltage $V_E$ to obtain the third voltage $V_F$. The capacitor 44 is charged at the third voltage $V_F$.

In parallel, the latch 22 delivers a fourth voltage $V_H$ from the converted voltages $V_D$ and $-V_E$.

Next, the switching assembly 24 multiplies the third voltage $V_F$ by the normalized state (0 or 1) of the fourth voltage $V_H$ to obtain a multiplied voltage $V_I$.

Lastly, the shifting circuit 26 shifts the amplitude of the multiplied voltage $V_I$ to obtain a control voltage $V_{out}$ of the transistor 10. In particular, the capacitor 60 of the shifting circuit 26 charges itself at a fifth voltage $V_J$ equal to the third voltage $V_F$ decreased by the voltage $V_Z$ of the Zener diode 62, making it possible to obtain a control voltage $V_{out}$ of the transistor 10 with two states $V_Z$ and $V_Z-V_F$.

Thus, the control voltage 12 makes it possible to choose the voltage shift of the control voltage $V_{out}$ so as to obtain a symmetrical or asymmetrical control voltage $V_{out}$ as a function of the controlled transistor 10. This makes it possible to eliminate existing problems with the current control devices that are not suitable for controlling transistors requiring an asymmetrical control voltage, such as silicon carbide transistors.

Furthermore, the control device 12 has a low impedance with respect to the gate of the transistor 10, irrespective of the control phase of the transistor 10. The control device 12 is thus less sensitive to the risks of disruptions by stray coupling, which may affect the state of the charge of the transistor 10 gate.

Furthermore, the transformer 18 of the control device 12 does not directly charge the gate of the transistor 10, but passes through a buffer component that is the capacitor 44 of the rectifier circuit 20, which makes it possible to desensitize the control device 12 to resonance phenomena.

The control device 12 also has a relatively limited number of components, which makes it possible to keep a compact enough control device 12. In particular, the control device 12 allows the transmission of power and control in parallel via the transformer 18 with midpoint 38 without using other components, such as optocouplers or additional transformers to transmit the control.

FIG. 12 additionally illustrates an on-board system 100, such as an aircraft, comprising a converter 111. The converter 111 comprises the transistor 10 and the control device 12 of the transistor 10.

The invention claimed is:

1. A device for controlling a transistor, the device comprising:
    a separating assembly for generating a first voltage from a DC input voltage, a first control signal and a second control signal, the first control signal and the second control signal each being formed by pulses with no temporal overlap between the pulses of said control signals, the first voltage being formed by:
        pulses of amplitude equal to the input voltage and in phase with the pulses of the first control signal, and
        pulse of amplitude equal to the opposite of the input voltage and in phase with the pulses of the second control signal,
    a transformer connected to the separating assembly, the transformer comprising two secondary windings, the two secondary windings being connected to one another at a midpoint, the first secondary winding being able to convert the first voltage to obtain a first converted voltage, the second secondary winding being able to convert the first voltage to obtain a second converted voltage, each of the first and second converted voltage being formed by:
pulses of amplitude with the same sign as the first voltage and in phase with the pulses of the first voltage having an amplitude equal to the input voltage, and
pulses of amplitude with the opposite sign from the first voltage and in phase with the pulses of the first voltage having an amplitude equal to the opposite of the input voltage,
a rectifier circuit able to extract the parts of the same sign from the first converted voltage and of opposite sign from the second converted voltage and to generate a third voltage from the extracted parts of the same sign,
a latch able to generate a fourth voltage from the converted voltages, the fourth voltage having a high state and a low state, the high state being triggered as a function of the sign of the amplitude of the first converted voltage, the low state being triggered as a function of the sign of the amplitude of the opposite of the second converted voltage,
a switching assembly able to multiply the third voltage by the normalized state of the fourth voltage to obtain a multiplied voltage, the multiplied voltage having two states corresponding to the states of the fourth voltage, one of the states having a value equal to the third voltage, the other state having a nil value, and
a shifting circuit able to shift the amplitude of the multiplied voltage to obtain a control voltage of the transistor, the control voltage having:
a peak-to-peak amplitude equal to the third voltage,
a high state corresponding to the high state of the fourth voltage, and
a low state corresponding to the low state of the fourth voltage and in which the sign of the control voltage is opposite the sign of the high state of the control voltage.

2. The device according to claim 1, wherein each of the rectifier circuit and the latch is directly connected to the transformer.

3. The device according to claim 1, wherein each of the first secondary winding and the second secondary winding is able to convert the first voltage by multiplying it by a same multiplication coefficient.

4. The device according to claim 1, wherein the first winding extends between a first terminal and the midpoint and the second winding extends between a second terminal and the midpoint, the rectifier circuit being connected to the midpoint and each of the first terminal and the second terminal, the latch being connected to the first terminal and the second terminal.

5. The device according to claim 1, wherein the rectifier circuit comprises:
a rectifier able to rectify the first converted voltage and the opposite of the second converted voltage to obtain a rectified voltage, the rectifier comprising a first diode and a second diode, the first diode being able to rectify the first converted voltage, the second diode being able to rectify the opposite of the second converted voltage, and
a capacitor able to charge itself to obtain the third voltage.

6. The device according to claim 1, wherein the high state of the fourth voltage is triggered during rising edges of the positive pulses of the converted first voltage, the low state of the fourth voltage being triggered during rising edges of the positive pulses of the opposite of the converted second voltage.

7. The device according to claim 1, wherein the multiplied voltage has two states, the shifting circuit comprising a capacitor and a Zener diode; the Zener diode being able, in one of the states of the multiplied voltage, to charge the capacitor to a fifth voltage equal to the third voltage decreased by the voltage of the Zener diode, and to produce a control voltage of the transistor equal to the voltage of the Zener diode.

8. The device according to claim 7, wherein the Zener diode is able, in the other state of the multiplied voltage, to produce a control voltage of the transistor equal to the opposite of the fifth voltage present across the terminals of the capacitor.

9. A converter comprising at least one transistor and at least one device for controlling the transistor according to claim 1.

10. An on-board system comprising a converter according to claim 9.

* * * * *